(12) United States Patent
Toyota et al.

(10) Patent No.: US 10,381,488 B2
(45) Date of Patent: Aug. 13, 2019

(54) DIALKYLZINC PARTIAL HYDROLYSATE-CONTAINING SOLUTION AND METHOD OF PRODUCTION OF ZINC OXIDE THIN FILM USING THE SOLUTION

(71) Applicant: Tosoh Finechem Corporation, Shunan-shi, Yamaguchi (JP)

(72) Inventors: Kouji Toyota, Shunan (JP); Koichiro Inaba, Shunan (JP); Toshio Naka, Shunan (JP)

(73) Assignee: Tosoh Finechem Corporation, Yamaguchi (JP)

( * ) Notice: Subject to any disclaimer, the term of this patent is extended or adjusted under 35 U.S.C. 154(b) by 0 days.

(21) Appl. No.: 15/574,746

(22) PCT Filed: May 10, 2016

(86) PCT No.: PCT/JP2016/063823
§ 371 (c)(1),
(2) Date: Nov. 16, 2017

(87) PCT Pub. No.: WO2016/185939
PCT Pub. Date: Nov. 24, 2016

(65) Prior Publication Data
US 2018/0145179 A1    May 24, 2018

(30) Foreign Application Priority Data

May 19, 2015   (JP) .................................. 2015-101817

(51) Int. Cl.
| | |
|---|---|
| *C01G 9/02* | (2006.01) |
| *H01B 1/22* | (2006.01) |
| *H01B 5/14* | (2006.01) |
| *C03C 17/25* | (2006.01) |
| *C23C 18/12* | (2006.01) |
| *H01L 29/786* | (2006.01) |

(52) U.S. Cl.
CPC ............ *H01L 29/7869* (2013.01); *C01G 9/02* (2013.01); *C03C 17/25* (2013.01); *C23C 18/1216* (2013.01); *C23C 18/1279* (2013.01); *H01B 1/22* (2013.01); *H01B 5/14* (2013.01); *C03C 2217/216* (2013.01)

(58) Field of Classification Search
CPC ....................................................... C01G 9/02
See application file for complete search history.

(56) References Cited

U.S. PATENT DOCUMENTS

| | | | |
|---|---|---|---|
| 2012/0094019 A1* | 4/2012 | Inaba ....................... | C01G 9/02 427/162 |
| 2015/0098883 A1* | 4/2015 | Xia ......................... | C01G 23/053 423/263 |

FOREIGN PATENT DOCUMENTS

| | | |
|---|---|---|
| CN | 102482113 A | 5/2012 |
| JP | H07182939 A | 7/1995 |
| JP | 2010254481 A | 11/2010 |
| WO | 2010123030 A1 | 10/2010 |
| WO | 2013/107017 A1 | 7/2013 |
| WO | 2016/027861 A1 | 2/2016 |

OTHER PUBLICATIONS

"Zinc Oxide Transparent Conductive Films: Towards Next-Generation Displays," Hakusui Tech Co., Ltd. General Magazine, Info, vol. 13, p. 1, 2005 (2 pages).
"Technology of Transparent Conductive Films," 166th Committee on Photonic and Electronic Oxide Materials of the Japan Society for the Promotion of Science, Second Edition (Revised), pp. 165-173, 2006.
Ohya et al, "Preparation of transparent, electrically conducting ZnO film from zinc acetate and alkoxide," Journal of Materials Science, vol. 29, pp. 4099-4103, 1994.
Aranovich et al, "Optical and electrical properties of ZnO films prepared by spray pyrolysis for solar cell applications," Journal of Vacuum Science and Technology, vol. 16, No. 4, pp. 994-1003, Jul./Aug. 1979.
Int'l Search Report and Written Opinion dated Jul. 5, 2016 in Int'l Application No. PCT/JP2016/063823.
Int'l Preliminary Report on Patentability dated Nov. 30, 2017 in Int'l Application No. PCT/JP2016/063823.
Ide et al, "Non-vacuum Process of ZnO Films by Spray Method," Memoirs of Faculty of Engineering, University of Miyazaki, No. 42, pp. 89-94, Aug. 30, 2013.

(Continued)

*Primary Examiner* — Peter F Godenschwager
(74) *Attorney, Agent, or Firm* — Panitch Schwarze Belisario & Nadel LLP (57) ABSTRACT

A dialkylzinc partial hydrolysate-containing solution which can be handled in air and can form a zinc oxide thin film in air and a method for producing the zinc oxide thin film are provided. The dialkylzinc partial hydrolysate-containing solution contains a partial hydrolysate of dialkyl zinc represented by general formula (1) and a solvent which has a boiling point of 160° C. or higher, an amide structure represented by general formula (2), and which is an organic compound having a cyclic structure. The partial hydrolysate is the dialkylzinc hydrolyzed with water in a molar ratio in the range of 0.4 to 0.9 with respect to zinc in the dialkylzinc. A method for producing the zinc oxide thin film by applying the dialkylzinc partial hydrolysate-containing solution to a base material is also provided.

$$ZnR^1{}_2 \tag{1}$$

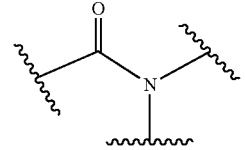

(2)

8 Claims, 4 Drawing Sheets

(56) References Cited

OTHER PUBLICATIONS

Takemo et al, "Growth of ZnO films using DEZ materials by spray method," The Japan Society of Applied Physics, vol. 71, p. 21, Aug. 30, 2010.
Office Action dated Sep. 29, 2018 in CN Application No. 201680028675.4.
Office Action dated Oct. 30, 2018 in JP Application No. 2015-10817.
Office Action dated Dec. 21, 2018 in EP Application No. 16796333.9.

* cited by examiner

DIALKYLZINC PARTIAL HYDROLYSATE-CONTAINING SOLUTION AND METHOD OF PRODUCTION OF ZINC OXIDE THIN FILM USING THE SOLUTION

TECHNICAL FIELD

The present invention relates to a dialkylzinc partial hydrolysate-containing solution having high chemical stability in air, and to a method of production of a zinc oxide thin film using the solution. A zinc oxide thin film can be formed also in air by using the dialkylzinc partial hydrolysate-containing solution of the present invention.

CROSS-REFERENCE TO RELATED APPLICATIONS

This application is a Section 371 of International Application No. PCT/JP2016/063823, filed May 19, 2015, which was published in the Japanese language on Nov. 24, 2016 under International Publication No. WO 2016/185939 A1, claiming the benefit of priority to Japanese Patent Application No. 2015-101817 filed on May 19, 2015, which are expressly incorporated herein by reference in their entirety.

BACKGROUND ART

Zinc oxide thin films having high transparency towards visible light are used in a broad range of applications such as photocatalyst films, UV cutting film, infrared reflective film, CIGS, buffer layers of organic thin-film solar cells, electrode films of dye-sensitized solar cells, antistatic films, thin-film transistors, compound semiconductor light-emitting devices, phosphor elements, antibacterial/deodorant films, piezoelectric films, varistor films, and plating films (Non Patent Literature 1).

Although various methods are known as production methods of transparent zinc oxide thin films (Non Patent Literature 2), production by coating, which boasts high productivity and low film production, costs is preferred herein, on account of the high film formation rates achieved, and also on account of equipment simplicity, in that it is not necessary to use a vacuum vessel.

Coating methods include for instance spin coating (Patent Literature 1), dip coating (Non Patent Literature 3), spray pyrolysis (Non Patent Literature 4) and the like.

A zinc oxide thin film is obtained through heating, at a substrate temperature of 350° C. or higher, after coating by spin coating, dip coating or spray pyrolysis.

Plastic substrates have come to be used as substrates of transparent zinc oxide thin films. Accordingly, heating during formation of the transparent zinc oxide thin film must be carried out at or below the heat resistance temperature of the plastic substrate. In the above spin coating, dip coating or spray pyrolysis methods, however, it is not possible to obtain a transparent zinc oxide thin film through heating at or below the heat resistance temperature of a plastic.

Therefore, studies by the inventors led to the finding of a method for forming a transparent zinc oxide thin film also at a temperature of 300° C. or lower, through the use of a solution containing a partial hydrolysate of dialkylzinc, obtained through reaction of dialkylzinc and water (Patent Literature 2).

[PTL 1] Japanese Patent Application Publication No. H07-182939
[PTL 2] Japanese Patent Application Publication No. 2010-254481 (Japanese Patent No. 5546154)

[NPL 1] "Zinc Oxide Transparent Conductive Films: Towards Next-Generation Displays" Hakusui Tech Co., Ltd. General magazine, Info, Volume 13 (2005) p1
[NPL 2] Technology of Transparent Conductive Films, edited by the 166th Committee on Photonic and Electronic Oxide Materials of the Japan Society for the Promotion of Science, Second edition (Revised), (2006) p 165 to 173
[NPL 3] Y. Ohya et al, J. Mater. Sci., 29 (1994) 4099
[NPL 4] J. Aranovich et al, J. Vac. Sci. Technol., 4 (1979) 16
PLT 1 to 2 and NPL 1 to 4 are expressly incorporated herein by reference in their entirety.

SUMMARY OF INVENTION

Technical Problem

The solution containing a partial hydrolysate of diethylzinc disclosed in Patent Literature 2 has reactivity with water or moisture. In order to form a transparent zinc oxide thin film, therefore, the film must be ordinarily produced in an inert gas such as nitrogen or argon supplied in a dry state, or in air having been subjected to a drying treatment. This has been problematic in that operations while maintaining an inert gas, or air in a dry state, require an inert gas and inert gas supply equipment, or air drying equipment, as well as gas holding equipment such as a glove box, all of which makes the costs of forming zinc oxide thin films ordinarily somewhat higher than those in ordinary coating methods.

An object of the present invention is to provide a dialkylzinc partial hydrolysate-containing solution, having high stability in moisture (humid air) contained in air (the atmosphere), being substantially not pyrophoric in air (the atmosphere), being amenable to be handled in air (the atmosphere) not having undergone a drying treatment, and that allows forming a zinc oxide thin film in air (the atmosphere) not having undergone a drying treatment. Further, the present invention provides a method of production of a zinc oxide thin film that can be carried out in air.

Solution to Problem

The present invention is as follows:

[1] A dialkylzinc partial hydrolysate-containing solution, comprising a partial hydrolysate of dialkylzinc represented by general formula (1) below, and a solvent, wherein
the solvent has a boiling point of equal to or higher than 160° C. and is an organic compound (hereinafter referred to as cyclic amide compound) having an amide structure represented by general formula (2) below and having a cyclic structure; and
the partial hydrolysate is obtained by hydrolyzing with water at a molar ratio to zinc of the dialkylzinc in a range of 0.4 to 0.9:

[C 1]

$$ZnR^1_2 \qquad (1)$$

(in the formula, $R^1$ is a linear or branched alkyl group having 1 to 6 carbon atoms.)

[C 2]

(2)

[2] The solution according to [1], wherein the cyclic amide compound is a compound having a boiling point in a range of 200° C. to 250° C.

[3] The solution according to [1] or [2], wherein the cyclic amide compound is contained at a molar ratio of equal to or higher than 1 with respect to zinc in the partial hydrolysate of dialkylzinc.

[4] The solution according to any one of [1] to [3], wherein the cyclic amide compound is N-methyl-2-pyrrolidone, 1,3-dimethyl-imidazolidinone, 1,3-dimethyl-3,4,5,6-tetrahydro-2(1H)-pyrimidinone, or a mixture thereof.

[5] The solution according to any one of [1] to [4], wherein the dialkylzinc is diethylzinc.

[6] The solution according to any one of [1] to [5], wherein the solution further comprises a solvent other than the cyclic amide compound, wherein the solvent other than the cyclic amide compound is at least one solvent selected from the group consisting of aliphatic hydrocarbons, alicyclic hydrocarbons, aromatic hydrocarbons, hydrocarbon solvents, ether compounds, ethylene glycol dialkyl ether compounds, diethylene glycol dialkyl ether compounds, triethylene glycol dialkyl ether compounds, propylene glycol dialkyl compounds, dipropylene glycol dialkyl and tripropylene glycol dialkyl compounds.

[7] A method of production of a zinc oxide thin film, comprising obtaining a zinc oxide thin film by coating a base material with the dialkylzinc partial hydrolysate-containing solution according to any one of [1] to [6], and then heating the base material at a temperature of equal to or lower than 300° C.

[8] The production method according to [7], wherein the coating is carried out in air.

[9] The production method according to [7] or [8], wherein the zinc oxide thin film has a transmittance of equal to or higher than 80% relative to visible light of 550 nm.

Advantageous Effects of Invention

The present invention succeeds in providing a dialkylzinc partial hydrolysate-containing solution, the solution being stable in air and being therefore easy to handle, while allowing forming a transparent zinc oxide thin film in air. Further, a transparent zinc oxide thin film can be formed through heating at a base material temperature of 300° C. or lower, when using the dialkylzinc partial hydrolysate-containing solution of the present invention.

DESCRIPTION OF EMBODIMENTS

[Solution Containing a Hydrolysate of Dialkylzinc]

A first aspect of the present invention is a dialkylzinc partial hydrolysate-containing solution, comprising a partial hydrolysate of dialkylzinc represented by general formula (1) below and a solvent. The solvent has a boiling point of 160° C. or higher and is an organic compound (also referred to as cyclic amide compound) having the amide structure represented by general formula (2) below and having a cyclic structure. The partial hydrolysate is obtained by hydrolyzing with water at a molar ratio to zinc in the dialkylzinc in the range of 0.4 to 0.9. The fact that the partial hydrolysate is obtained through hydrolysis of dialkylzinc, through addition of water to a mixture of the dialkylzinc and the cyclic amide compound, is appropriate herein in that the dialkylzinc partial hydrolysate-containing solution of the present invention can be thus obtained as a result of a hydrolysis operation.

[C 3]

$$ZnR^1_2 \quad (1)$$

(In the formula, $R^1$ is a linear or branched alkyl group having 1 to 6 carbon atoms.)

Examples of the alkyl group include for instance, although not limited thereto, methyl groups, ethyl groups, isopropyl groups, isobutyl groups, and tert-butyl groups.

[C 4]

(2)

The cyclic amide compound has preferably a boiling point in the range of 200° C. to 250° C., and can be more specifically N-methyl-2-pyrrolidone (also abbreviated as NMP; boiling point 204° C.), 1,3-dimethyl-imidazolidinone (boiling point 220° C.), 1,3-dimethyl-3,4,5,6-tetrahydro-2(1H)-pyrimidinone (boiling point about 245° C.), or a mixture of the foregoing.

The underlying reason of the enhanced stability glass in air brought about through the use of the cyclic amide compound as the solvent is not clear. Without being bound by theory, it is estimated that the stability in air of the cyclic amide compound, which does not volatilize readily by virtue of having a comparatively high boiling point, is significantly increased thanks to coordination bonds, with zinc, by unshared electron pairs of oxygen and nitrogen in the amide structure, a decrease in bulkiness derived from the cyclic structure, and an increase in rigidity arising from the cyclic structure. Compounds having an amide structure react ordinarily with dialkylzinc. It was therefore expected that dialkylzinc would presumably exhibit chemical changes by being mixed with the cyclic amide compound. However, it was unexpectedly found that dialkylzinc and the cyclic amide compound do not react, that the state of the dialkylzinc is preserved, and that stability in air of the partial hydrolysate is increased, even after partial hydrolysis of the dialkylzinc. The present invention was perfected on the basis of that finding.

Examples of the dialkylzinc represented by general formula (1) include for instance dimethylzinc, diethylzinc, diisopropylzinc, diisobutylzinc, di-tert-butylzinc and the like. Preferred herein is diethylzinc, given the low cost thereof. However, the dialkylzinc represented by general formula (1) is not meant to be limited to the foregoing compounds.

Preferably, the molar ratio of the cyclic amide compound with respect to zinc in the partial hydrolysate of dialkylzinc is set to equal to or higher than 1, from the viewpoint of obtaining a chemically stable solution containing a partial hydrolysate. Preferably, the molar ratio with respect to zinc in the partial hydrolysate of dialkylzinc is equal to or higher than 2, more preferably equal to or higher than 3. The upper limit can be set as appropriate for instance in accordance with the concentration of the dialkylzinc or the concentration of the partial hydrolysate in the solution, and depending on the presence or absence, and content, of a solvent other than the cyclic amide compound. For instance, the upper limit may be equal to or lower than 20, preferably equal to or lower than 18, more preferably equal to or lower than 16, and yet more preferably equal to or lower than 14. Although the chemical stability in air is increased as compared with that of the dialkylzinc by making the dialkylzinc into a partial hydrolysate thereof, stability is still lacking, and accordingly it is preferable to prepare a mixture with the above predetermined amount of the cyclic amide compound, from the viewpoint of obtaining a more chemically stable solution containing a partial hydrolysate.

The dialkylzinc partial hydrolysate-containing solution of the present invention can further contain a solvent other than the cyclic amide compound. Examples of solvents other than the cyclic amide compound include for instance aliphatic hydrocarbons such as n-hexane, octane, and n-decane; alicyclic hydrocarbons such as cyclopentane, cyclohexane, methylcyclohexane, and ethylcyclohexane; aromatic hydrocarbons such as benzene, toluene, xylene, and cumene; hydrocarbon solvents such as mineral spirit, solvent naphtha, kerosene, and petroleum ether; ether compounds such as diethyl ether, tetrahydrofuran, t-butyl methyl ether, di-n-propyl ether, diisopropyl ether, 1,4-dioxane, 1,3-dioxolane, dibutyl ether, cyclopentyl methyl ether, and anisole; ethylene glycol dialkyl ether compounds such as 1,2-dimethoxyethane, 1,2-diethoxyethane, and 1,2-dibutoxyethane; diethylene glycol dialkyl ether compounds such as diethylene glycol dimethyl ether, diethylene glycol diethyl ether, and diethylene glycol dibutyl ether; triethylene glycol dialkyl ether compounds such as triethylene glycol dimethyl ether, and triethylene glycol diethyl ether; propylene glycol dialkyl compounds such as propylene glycol dimethyl ether; dipropylene glycol dialkyls such as dipropylene glycol dimethyl; and tripropylene glycol dialkyl compounds such as tripropylene glycol dimethyl. The addition amount of the solvent other than the cyclic amide compound is not limited so long as the effect of the cyclic amide compound is not impaired, and for instance can be set to 100 parts by mass or less with respect to 100 parts by mass of the cyclic amide compound. The range of allowable addition varies depending on the type of the dialkylzinc, the type of the cyclic amide compound, and the type of the solvent other than the cyclic amide compound. In the present invention the chemical stability of the partial hydrolysate of dialkylzinc tends to depend on the molar ratio of the cyclic amide compound with respect to zinc in the partial hydrolysate of dialkylzinc. The amount of the solvent other than the cyclic amide compound is not limited so long as the molar ratio of the cyclic amide compound with respect to zinc in the partial hydrolysate of dialkylzinc is sufficient to secure chemical stability.

The partial hydrolysate of dialkylzinc is prepared by using water or a water-containing solution in a molar ratio lying in the range of 0.4 to 0.9 with respect to the dialkylzinc. With a molar ratio lower than 0.4 of water with respect to dialkylzinc it is difficult to form a uniform zinc oxide thin film, in that the liquid state tends to persist (a solid state is not achieved readily) even after removal of the solvent by drying. More preferably, the molar ratio of water with respect to the dialkylzinc is 0.6 or higher, from the viewpoint of forming a uniform zinc oxide thin film. When on the other hand the molar ratio of water with respect to the dialkylzinc exceeds 0.9, an insoluble gel or solid precipitates in the solvent, and it becomes difficult to form a uniform zinc oxide thin film out of that gel or solid. The precipitated gel or solid can be removed by filtration, but this is undesirable on account of the loss of zinc incurred in doing so.

With reactivity towards dialkylzinc in mind, the partial hydrolysate of dialkylzinc is specifically prepared for instance by adding water or a water-containing solution to a solution resulting from dissolving the dialkylzinc in the cyclic amide compound, and, as desired, in a solvent other than the cyclic amide compound, or in a solution resulting from dissolving the dialkylzinc in a solvent other than the cyclic amide compound, in a dry atmosphere (for instance, in an inert gas atmosphere that is supplied in a dry state). Herein there may be added water itself (pure water not being a mixture with a solvent), but preferably there is added a solution containing water, from the viewpoint of controlling heat generation during the reaction between the dialkylzinc and water. The solvent in the water-containing solution may be any one from among a cyclic amide compound, a mixed solvent of the cyclic amide compound and a solvent other than the cyclic amide compound, or a solvent other than the cyclic amide compound, but preferably a cyclic amide compound is used herein from the viewpoint of the solubility of water in the solvent and ease of production. In a case where water or a water-containing solution is added to a solution resulting from dissolving the dialkylzinc in a solvent other than the cyclic amide compound, the composition of the present invention can be prepared by using a cyclic amide compound as the solvent of the water-containing solution, or by adding the cyclic amide compound after partial hydrolysis is over.

The concentration of dialkylzinc in the dialkylzinc solution having water or a water-containing solution added thereto can be set to 0.1 to 50 mass %, but lies preferably in the range of 0.1 to 30 mass %, in terms of ease of film formation by coating (for example in terms of adhesion, homogeneity and the like of the formed film). The above ranges are however exemplary, and are not meant to be limiting.

Addition of water or a water-containing solution to the dialkylzinc solution can be decided as appropriate depending for instance on the type and volume of the starting materials to be mixed, but can be set for instance to lie in the range of 1 minute to 10 hours. The temperature during addition can be selected arbitrarily within the range of −20°

C. to 150° C. The temperature preferably lies in the range of −20° C. to 80° C., for instance with safety in mind. The above ranges are however exemplary, and are not meant to be limiting.

After addition of water or a water-containing solution, aging can be conducted for 0.1 to 50 hours in order to further drive the progress of partial hydrolysis of the dialkylzinc elicited by water. Any temperature in the range of −20° C. to 150° C. can be selected as the aging temperature. The above ranges are however exemplary, and are not meant to be limiting.

The cyclic amide compound, and, as desired, a solvent other than the cyclic amide compound, dialkylzinc and water or a water-containing solution, can be introduced into a reaction vessel in accordance with any common method. The pressure in the reaction vessel is not limited. The hydrolysis reaction step is not particularly limited, and may involve any from among a batch operation, a semi-batch operation and a continuous operation, but preferably a batch operation.

The dialkylzinc partial hydrolysate-containing solution is obtained as a result of the above partial hydrolysis. Compositions of partial hydrolysates have been analyzed for a long time. There is however variability among the reported composition results of the products, and product compositions have not been clearly identified. Further, product compositions vary with solvent, concentration, addition molar ratio of water, addition temperature, reaction temperature, reaction time and so forth.

It is estimated that the partial hydrolysate of dialkylzinc in the method of the present invention is a mixture of compounds containing the structural units represented by general formula (3) below.

[C 5]

$$R^1-Zn-[O-Zn]_m-R^1 \quad (3)$$

(In the formula, $R^1$ is identical to $R^1$ in general formula (1), and m is an integer from 1 to 20.)

The above partial hydrolysis is preferably carried out under conditions such that a solid (gel) or the like does not precipitate, and the solid (gel) or the like is a complete hydrolysate (zinc oxide) in which hydrolysis of dialkylzinc has advanced, or a partial hydrolysate in which m in general formula (3) exceeds 20, the amount of alkyl groups $R^1$ in the molecule has decreased, and solubility towards the solvent is lower. In a case where such a solid (gel) or the like precipitates once partial hydrolysis is over, the solid or the like can be removed by purification in accordance with a method such as filtration, centrifugation, or decantation. As a result of the removal operation there can be obtained a dialkylzinc partial hydrolysate-containing solution, having good transparency and suitable for preparing zinc oxide thin film, the solution containing substantially only a partial hydrolysate dissolved in the solvent.

The solids concentration of the dialkylzinc partial hydrolysate-containing solution can be adjusted (increased) for instance through concentration (solvent removal). After the solution has been optionally concentrated, the solids concentration, polarity, viscosity, boiling point, economy and so forth can be adjusted, as appropriate, through addition of a solvent used in the hydrolysis reaction or a solvent different from the solvent used in the hydrolysis reaction.

Examples of the solvent other than the solvent used in the hydrolysis reaction include for instance aliphatic hydrocarbons such as n-hexane, octane, and n-decane; alicyclic hydrocarbons such as cyclopentane, cyclohexane, methylcyclohexane, and ethylcyclohexane; aromatic hydrocarbons such as benzene, toluene, xylene, and cumene; other hydrocarbon solvents such as mineral spirit, solvent naphtha, kerosene, petroleum ether and the like; ether compounds such as diethyl ether, tetrahydrofuran, t-butyl methyl ether, di-n-propyl ether, diisopropyl ether, 1,4-dioxane, 1,3-dioxolane, dibutyl ether, cyclopentyl methyl ether, and anisole; ethylene glycol dialkyl ether compounds such as 1,2-dimethoxyethane, 1,2-diethoxyethane, and 1,2-dibutoxyethane; diethylene glycol dialkyl ether compounds such as diethylene glycol dimethyl ether, diethylene glycol diethyl ether, and diethylene glycol dibutyl ether; triethylene glycol dialkyl ether compounds such as triethylene glycol dimethyl ether, and triethylene glycol diethyl ether; propylene glycol dialkyl compounds such as propylene glycol dimethyl ether; dipropylene glycol dialkyls such as dipropylene glycol dimethyl; and tripropylene glycol dialkyl compounds such as tripropylene glycol dimethyl. Also where there is utilized a solvent different from the solvent used in the hydrolysis reaction, the amount of cyclic amide compound in the solution containing a partial hydrolysate of dialkylzinc that is obtained is appropriately kept at 1 or higher preferably 2 or higher, and more preferably 3 or higher, on a molar ratio basis, with respect to zinc in the dialkylzinc partial hydrolysate-containing solution, from the viewpoint of preserving the effect of the present invention.

The content of the partial hydrolysate of dialkylzinc in the dialkylzinc partial hydrolysate-containing solution of the present invention can be appropriately established depending on the intended use. The content can be adjusted through adjustment of the amount of the cyclic amide compound and/or the amount of the solvent other than the cyclic amide compound. The content of partial hydrolysate of dialkylzinc can be adjusted as appropriate for instance within the range of 0.1 to 50 mass % taking into consideration, among others, properties suitable to the production of the zinc oxide thin film described below. However, the content of partial hydrolysate of dialkylzinc is not meant to be limited to the above range.

[Method of Production of a Zinc Oxide Thin Film]

A second aspect of the present invention is a method of production of a zinc oxide thin film, being a method for obtaining a zinc oxide thin film, the method comprising coating a base material with the dialkylzinc partial hydrolysate-containing solution of the present invention.

The above solution can be coated onto the base material in accordance with a common method such as spin coating, dip coating, screen printing, bar coating, slit coating, die coating, gravure coating, roll coating, curtain coating, spray pyrolysis, electrostatic spray pyrolysis, inkjet, and mist CVD.

Coating of the base material with the solution can be performed in an inert atmosphere or in an air atmosphere, but is preferably carried out in an air atmosphere from the viewpoint of economy and also in terms of convenience of equipment.

Coating of the base material with the solution can be performed under pressure or under reduced pressure, but is preferably carried out in an air atmosphere from the viewpoint of economy and also in terms of convenience of equipment.

The base material is not particularly limited, and may be for instance glass such as lead glass, soda glass, borosilicate glass, and alkali-free glass; an oxide such as silica, alumina, titania, zirconia, and a complex oxide; a polymer such as polyethylene (PE), polypropylene (PP), polyethylene terephthalate (PET), polyethylene naphthalate (PEN), polymethyl methacrylate (PMMA), polycarbonate (PC), polyphenylene sulfide (PPS), polystyrene (PS), polyvinyl alcohol (PVA), polyvinyl chloride (PVC), polyvinylidene chloride, a cyclic polyolefin (COP), an ethylene-vinyl acetate copolymer (EVA), a polyimide, a polyamide, polyethersulfone (PES), a polyurethane, triacetate, triacetyl cellulose (TAC), cellophane, polytetrafluoroethylene (PTFE), polychlorotrifluoroethylene (PCTFE), polyvinylidene fluoride (PVDF), polyvinyl fluoride (PVF), a perfluoroalkoxy fluororesin (PFA), an ethylene-tetrafluoroethylene copolymer (ETFE), and an ethylene-chlorotrifluoroethylene copolymer (ECTFE).

The shape of the base material is not particularly limited, and examples thereof include for instance powder, films, plates, or three-dimensional structures having a three-dimensional shape.

In the base material coated with the dialkylzinc partial hydrolysate-containing solution, the solvent is dried off at a predetermined temperature, followed by firing at a predetermined temperature, or alternatively, drying and firing are performed in parallel at a predetermined temperature. A zinc oxide thin film can be formed as a result. In a case where coating is carried out by spray pyrolysis, electrostatic spray pyrolysis, inkjet, or mist CVD, the base material can be heated to a predetermined temperature prior to coating. This makes it possible to dry off the solvent simultaneously with coating, or to perform firing simultaneously with drying.

The temperature for drying the solvent is preferably 300° C. or lower, and lies more preferably in the range of 20° C. to 250° C., for instance with the heat resistance of the base material in mind. The solvent can be dried for instance over 0.5 to 60 minutes. The above ranges are however not meant to be limiting.

Firing for forming the zinc oxide can be carried out at any temperature, for instance in the range of 50° C. to 550° C. Herein it is appropriate to set a temperature such that the base material is not damaged, with the type (heat resistance) of the base material in mind. From the viewpoint of forming a zinc oxide thin film so as to preclude damage to the base material, even a base material having a low heat resistance, in the method of the present invention it is appropriate to form the zinc oxide thin film by firing a coating film of the dialkylzinc partial hydrolysate-containing solution at a temperature of equal to or lower than 300° C. The firing temperature lies more preferably in the range of 50° C. to 250° C., yet more preferably in the range of 50° C. to 200° C., and even yet more preferably in the range of 50° C. to 150° C. Firing can be carried out in parallel with solvent drying in a case where the predetermined temperature for firing is identical to the predetermined temperature for solvent drying. Regarding firing time, firing can be performed for instance over 0.5 to 300 minutes, both in a case of firing at a different temperature after a precursor film has been obtained through solvent drying and in a case where solvent drying and firing are carried out in parallel. The firing time can be set as appropriate depending for instance on the firing temperature, the composition of the solution containing a partial hydrolysate of dialkylzinc, the thickness of the coating film and so forth.

The thickness of the zinc oxide thin film thus obtained can be for instance of 0.005 to 3 µm. The thickness of the zinc oxide thin film having been formed in a single operation can be adjusted through adjustment of the composition and/or concentration of the dialkylzinc partial hydrolysate-containing solution, and adjustment of the coating method and conditions. A thicker film can be obtained by repeating as needed, a plurality of times, the above coating, drying and firing steps.

The crystallinity and denseness of zinc oxide can be increased as needed by heating, at a predetermined temperature, the zinc oxide thin film obtained as described above, in an oxidizing gas atmosphere of oxygen or the like, a reducing gas atmosphere of hydrogen or the like, a steam atmosphere in which a large amount of moisture is present, or a plasma atmosphere of argon, nitrogen, oxygen or the like. Residual organic matter or the like in the zinc oxide thin film that is obtained can be removed through light irradiation of ultraviolet rays or the like, or through a microwave treatment.

EXAMPLES

The present invention will be explained next in more detail based on examples. The examples are however illustrative of the invention, which is not meant to be limited to the examples.

A dialkylzinc partial hydrolysate-containing solution of the present invention was prepared in a nitrogen gas atmosphere. All the solvents used had been dehydrated and degassed.

<Measurement of Physical Properties>

Each dialkylzinc-containing solution or solution containing a partial hydrolysate of dialkylzinc of the present invention was dissolved in $C_6D_6$, and thereafter a 1H-NMR measurement was performed using an NMR apparatus ("JNM-ECA500" by JEOL RESONANCE Inc.).

Each zinc oxide thin film produced in accordance with the production method of the present invention was subjected to IR measurement in a relative manner, without ATR correction by ATR (Attenuated Total Reflection) using an ZnSe prism, in an FT-IR spectrometer ("FT/IR-4100" by JASCO Corporation).

Thin films the refractive index of which exceeds 1.7 are difficult to measure when using a conventional ZnSe prism, and it was inferred that measurement would be likewise difficult given that the refractive index of ordinary zinc oxide is 1.9. Surprisingly, the measurements could nevertheless be carried out.

The thickness of the zinc oxide thin films produced in accordance with the production method of the present invention was measured using a stylus profilometer (Dektak XT-S, by Bruker Corporation, upon scraping of part of the film with a knife.

Reference Example 1

Figure 1:
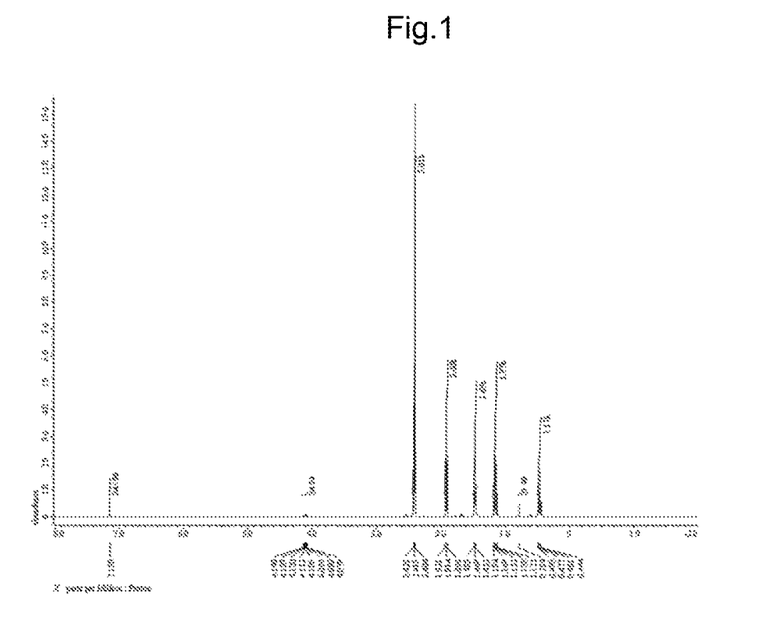
FIG. 1 is a 1H-NMR spectrum of an NMP solution of diethylzinc.

Herein 2.15 g of diethylzinc (by Tosoh Finechem Corporation) were added, at 25° C., to 5.0 g of N-methyl-2-pyrrolidone (hereafter NMP), with thorough stirring, to yield a 30 mass % NMP solution of diethylzinc. A wholly identical NMR spectrum was obtained upon re-measurement after 24 hours, as illustrated in FIG. 1.

NMR (1H, $C_6D_6$, ppm)

Diethylzinc

[C 6]

0.46, q, —$CH_2$—$CH_3$, 1.47, t, —$CH_2$—$CH_3$

NMP

[C 7]

1.15, m, —CH₂—CH₂—CH₂—
1.91, t, —N—CH₂—CH₂—  |  CH₃
2.40, s, —N—CH₃
2.42, t, —CH₂—C—N—  ||  O

Example 1

Figure 2:
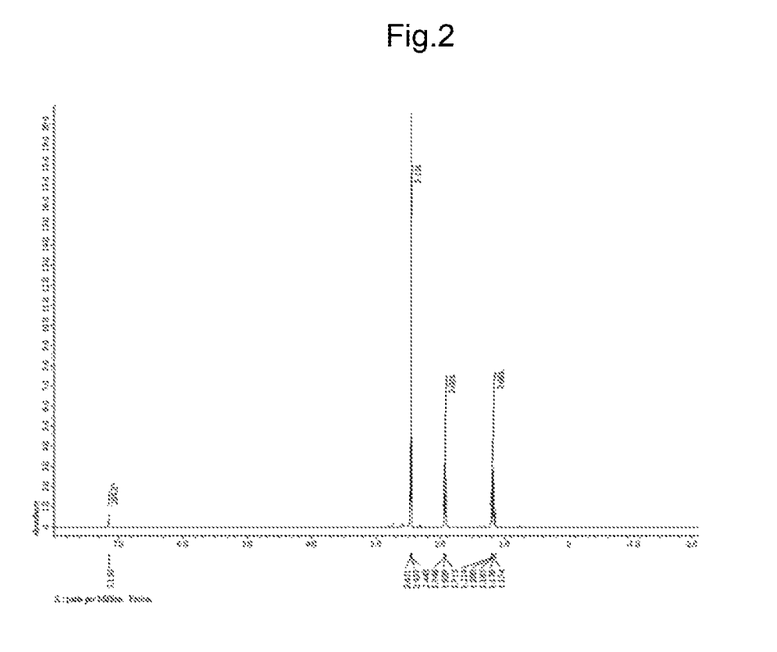
FIG. 2 is a 1H-NMR spectrum of an NMP solution of a diethylzinc hydrolysate.

Herein 10.0 of diethylzinc (by Tosoh Finechem Corporation) were added, at 25° C., to 90.0 g of NMP, with thorough stirring (NMP/diethylzinc (molar ratio)=11.2). The whole was cooled down to −15° C., and thereafter 11.6 g of an 11.5 mass % water-containing NMP solution ([water]/[diethylzinc]=0.6) was added dropwise over 90 minutes. After aging for 30 minutes at −15° C., the temperature was raised to 25° C. followed by continued stirring for 5 hours, to conduct an aging reaction, and yield a pale-yellow transparent NMP solution of a partially hydrolyzed diethylzinc composition. The composition exhibited no pyrophoricity when a small amount thereof was taken out into to air (humidity of about 40%). A spectrum obtained by NMR measurement was as the one illustrated in FIG. 2, with the ethyl group-derived peaks of diethylzinc being lost, as compared with the spectrum of Example 1. The diethylzinc of the starting material was accordingly found to have disappeared.

Example 2

Herein 10.0 g of diethylzinc (by Tosoh Finechem Corporation) were added, at 25° C., to 90.0 g of NMP, with thorough stirring (NMP/diethylzinc (molar ratio)=11.2). The whole was cooled down to −15° C., and thereafter 15.4 g of an 11.5 mass % water-containing NMP solution ([water]/[diethylzinc]=0.8) was added dropwise over 90 minutes. After aging for 30 minutes at −15° C., the temperature was raised to 25° C. followed by continued stirring for 5 hours, to conduct an aging reaction, and yield a pale-yellow transparent NMP solution of a partially hydrolyzed diethylzinc composition. The composition exhibited no pyrophoricity when a small amount thereof was taken out into to air (humidity of about 40%).

Example 3

Herein 10.0 g of mixed xylenes and 10.0 g of diethylzinc (by Tosoh Finechem Corporation) were added, at 25° C., to 80.0 g of NMP, with thorough stirring (NMP/diethylzinc (molar ratio)=9.97). The whole was cooled down to −15° C., and thereafter 11.5 g of an 11.5 mass % water-containing NMP solution ([water]/[diethylzinc]=0.6) was added dropwise over 90 minutes. After aging for 30 minutes at −15° C., the temperature was raised to 25° C. followed by continued stirring for 5 hours, to conduct an aging reaction, to yield a pale-yellow transparent NMP/xylene mixed solution of a partially hydrolyzed diethylzinc composition. The composition exhibited no pyrophoricity when a small amount thereof was taken out into to air (humidity of about 40%).

Reference Example 1

Herein 10.0 g of diethylzinc (by Tosoh Finechem Corporation) were added, at 25° C., to 90.0 g of NMP, with thorough stirring (NMP/diethylzinc (molar ratio)=11.2). The whole was cooled down to −15° C., and thereafter 19.4 g of an 11.5 mass % water NMP solution ([water]/[diethylzinc]=1.0) was added dropwise over 90 minutes. After aging for 30 minutes at −15° C., the temperature was raised to 25° C. followed by continued stirring for 5 hours, to conduct an aging reaction, and yield a pale-yellow transparent NMP solution of a partially hydrolyzed diethylzinc composition. However, gelling occurred within a few days giving rise to a composition, in the form of a pale-yellow transparent solid, that was difficult to apply.

Example 4

Herein 100 μl of the NMP solution of a partially hydrolyzed diethylzinc composition obtained in Example 1 were dropped onto a 15 mm square glass substrate (Eagle XG, by Corning Inc.), in an air atmosphere, and the glass substrate was coated through spinning for 20 seconds at 2000 rpm, using a spin coater. A thin film was then formed by heating and drying for 5 minutes at 100° C.

Figure 3:
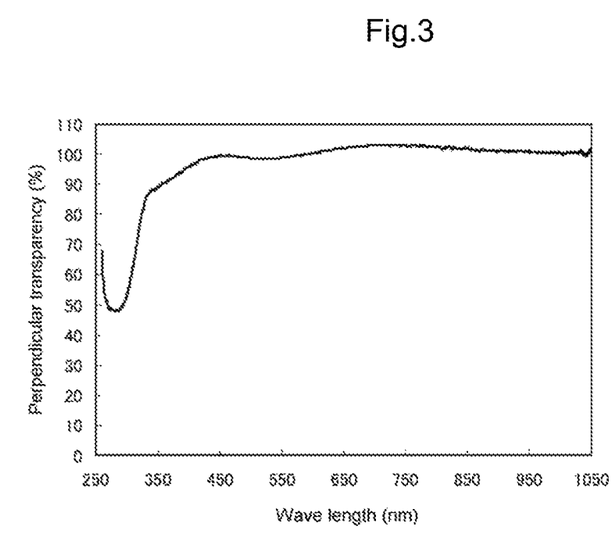
FIG. 3 is a normal transmittance spectrum of a zinc oxide thin film.
Figure 4:
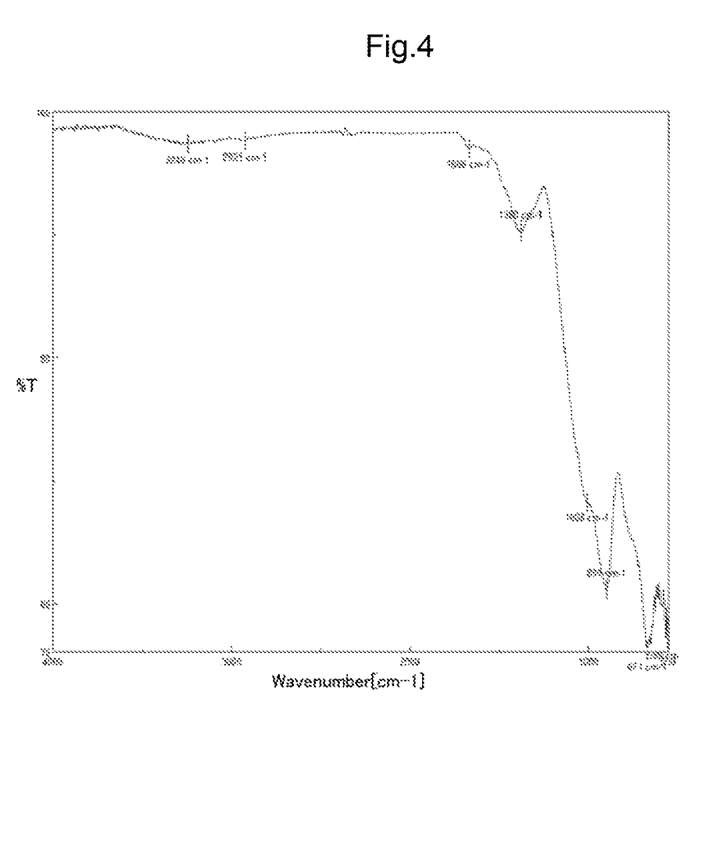
FIG. 4 is an IR spectrum, by ATR, of a zinc oxide thin film.
Figure 5:
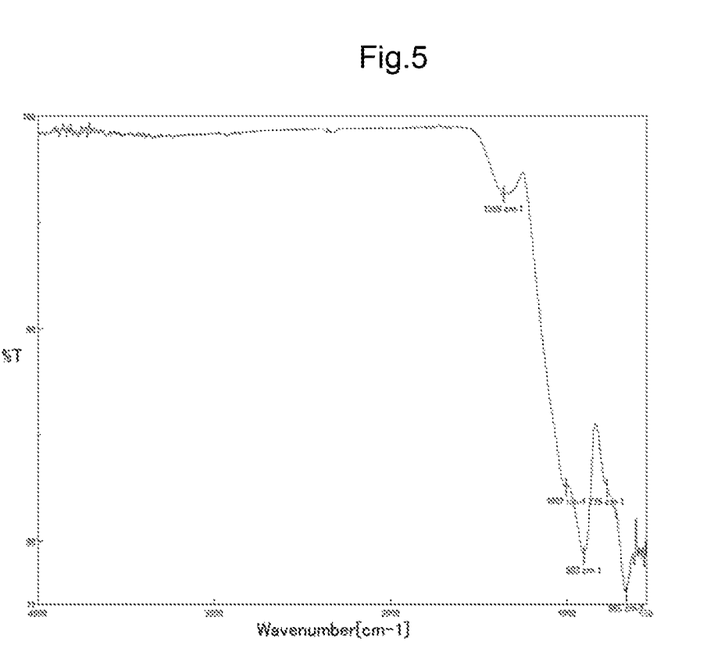
FIG. 5 is an IR spectrum, by ATR, of a glass substrate (Eagle XG, by Corning Inc.).

A measurement of normal transmittance revealed that the normal transmittance towards 550 nm light, as obtained from a spectrum such as the one illustrated in FIG. 3, was 99%. Formation of zinc oxide was confirmed by virtue of the low normal transmittance in the ultraviolet region. A spectrum such as the one illustrated in FIG. 4 was obtained in an IR measurement by ATR. Broad Zn—O—Zn vibration peaks were observed approximately from 550 to 1500 cm$^{-1}$, and broad Zn—OH vibration peaks were observed approximately from 2500 to 4000 cm$^{-1}$, which revealed that Zn—O—Zn and Zn—OH bonds had formed. Formation of a zinc oxide thin film was thus confirmed. There were virtually no vibration peaks of organic matter around 3000 cm$^{-1}$, which indicated that little residual organic matter had remained. The IR spectrum by ATR of the glass substrate itself, in FIG. 5, is clearly different from that of FIG. 4. Film thickness was 323 nm.

Example 5

A thin film was produced in the same way as in Example 4, but herein there was dropped the NMP solution of a partially hydrolyzed diethylzinc composition obtained in Example 2.

Figure 6:
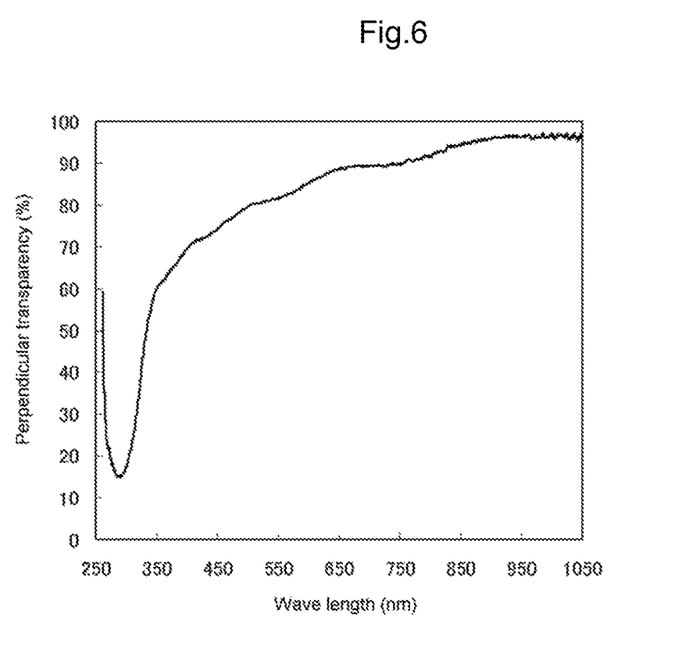
FIG. 6 is a normal transmittance spectrum of a zinc oxide thin film.
Figure 7:
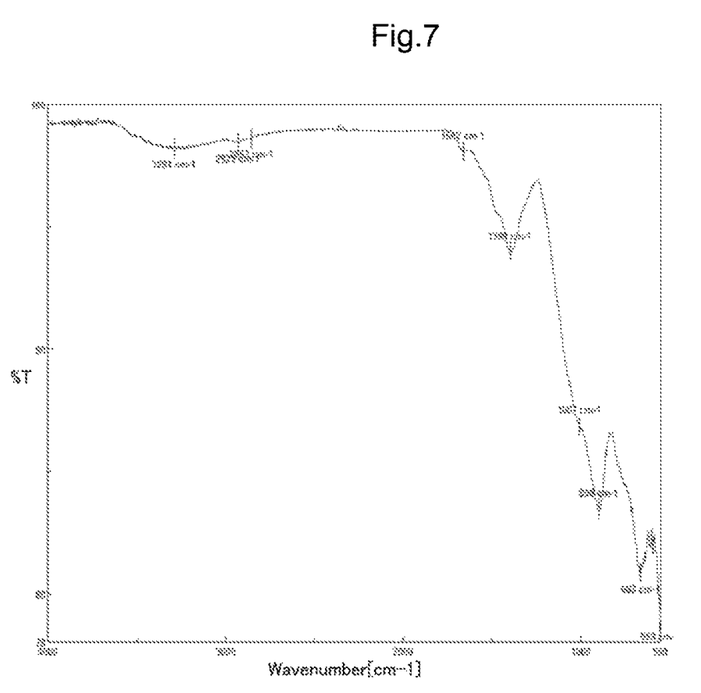
FIG. 7 is an IR spectrum, by ATR, of a zinc oxide thin film.

A measurement of normal transmittance revealed that the normal transmittance towards 550 nm light, as obtained from a spectrum such as the one illustrated in FIG. 6, was 82%. Formation of zinc oxide was confirmed by virtue of the low normal transmittance in the ultraviolet region. A spectrum such as the one illustrated in FIG. 7 was obtained in an IR measurement by ATR. Broad Zn—O—Zn vibration peaks were observed approximately from 550 to 1500 cm$^{-1}$, and broad Zn—OH vibration peaks were observed approximately from 2500 to 4000 cm$^{-1}$, which confirmed the formation of Zn—O—Zn and Zn—OH bonds. Formation of a zinc oxide thin film was thus confirmed. There were virtually no vibration peaks of organic matter around 3000 cm$^{-1}$, which indicated that little residual organic matter had remained. The IR spectrum by ATR of the glass substrate itself, in FIG. 5, is clearly different from that of FIG. 7. Film thickness was 815 nm.

Comparative Example 1

Herein 10.0 g of diethylzinc (by Tosoh Finechem Corporation) were added, at 25° C., to 90.0 g of tetrahydrofuran, with thorough stirring. The whole was cooled down to −15° C., and thereafter 11.5 g of an 11.5 mass % water-containing tetrahydrofuran (hereafter THF) solution ([water]/[diethylzinc]=0.6) was added dropwise over 90 minutes. After aging for 30 minutes at −15° C., the temperature was raised to 25° C. followed by continued stirring for 5 hours, to conduct an aging reaction, to yield a pale-yellow transparent THF mixed solution of a partially hydrolyzed diethylzinc composition.

A thin film was formed in the same way as in Example 4, but through dropping herein of the above mixed solution. The measured normal transmittance at light of 550 nm was 63%, i.e. that of an opaque thin film having a normal transmittance lower than 80%.

INDUSTRIAL APPLICABILITY

The present invention is useful in the field of production of zinc oxide thin films. Zinc oxide thin films include for instance photocatalyst films, UV cutting films, infrared reflection films, CIGS, buffer layers of organic thin-film solar cells, electrode films of dye sensitized solar cells, antistatic films, thin-film transistors, compound semiconductor light-emitting devices, phosphor elements, antibacterial/deodorant films, piezoelectric films, varistor films, and plating films.

The invention claimed is:

1. A dialkylzinc partial hydrolysate-containing solution, comprising a partial hydrolysate of dialkylzinc represented by general formula (1) below and a solvent, wherein
the solvent is an organic compound (hereinafter referred to as cyclic amide compound) having a boiling point in a range of 200° C. to 250° C., an amide structure represented by general formula (2) below and having a cyclic structure; and
the partial hydrolysate is obtained by hydrolyzing with water at a molar ratio to zinc of the dialkylzinc in a range of 0.4 to 0.9:

$$ZnR^1_2 \quad (1)$$

wherein $R^1$ is a linear or branched alkyl group having 1 to 6 carbon atoms (2)

2. The solution according to claim 1, wherein the cyclic amide compound is contained at a molar ratio of equal to or higher than 1 with respect to zinc in the partial hydrolysate of dialkylzinc.

3. The solution according to claim 1, wherein the cyclic amide compound is N-methyl-2-pyrrolidone, 1,3-dimethylimidazolidinone, 1,3-dimethyl-3,4,5,6-tetrahydro-2(1H)-pyrimidinone, or a mixture thereof.

4. The solution according to claim 1, wherein the dialkylzinc is diethylzinc.

5. The solution according to claim 1, wherein the solution further comprises a solvent other than the cyclic amide compound, wherein the solvent other than the cyclic amide compound is at least one solvent selected from the group consisting of aliphatic hydrocarbons, alicyclic hydrocarbons, aromatic hydrocarbons, hydrocarbon solvents, ether compounds, ethylene glycol dialkyl ether compounds, diethylene glycol dialkyl ether compounds, triethylene glycol dialkyl ether compounds, propylene glycol dialkyl compounds, dipropylene glycol dialkyl and tripropylene glycol dialkyl compounds.

6. A method of production of a zinc oxide thin film, comprising obtaining a zinc oxide thin film by coating a base material with the dialkylzinc partial hydrolysate-containing solution according to claim 1, and then heating the base material at a temperature of equal to or lower than 300° C.

7. The production method according to claim 6, wherein the coating is carried out in air.

8. The production method according to claim 6, wherein the zinc oxide thin film has a transmittance of equal to or higher than 80% relative to visible light of 550 nm.

* * * * *